United States Patent

[11] 3,602,983

[72] Inventors Michael Murray Bertioli
Lichfield;
David Everitt Millington, Solihull, both of, England

[21] Appl. No. 695,794
[22] Filed Jan. 4, 1968
[45] Patented Sept. 7, 1971
[73] Assignee Joseph Lucas (Industries) Limited
Birmingham, England
[32] Priority Jan. 19, 1967
[33] Great Britain
[31] 2893/67

[54] METHOD OF MANUFACTURING SEMICONDUCTOR CIRCUITS
1 Claim, 3 Drawing Figs.

[52] U.S. Cl. .......... 29/577, 29/626
[51] Int. Cl. .......... B01j 17/00, H01i 1/16, H01i 1/24, H01i 7/68
[50] Field of Search .......... 29/577, 588, 589, 590, 591, 626, 627, 592, 593

[56] References Cited

UNITED STATES PATENTS

| | | | |
|---|---|---|---|
| 2,804,581 | 8/1957 | Lichtgarn .......... | 317/235 |
| 3,235,937 | 2/1966 | Lanzl et al. .......... | 29/583 |
| 3,264,715 | 8/1966 | Siebertz .......... | 29/591 |
| 3,281,628 | 10/1966 | Bauer et al. .......... | 317/234 |
| 3,325,586 | 6/1967 | Suddick .......... | 174/52 |
| 3,341,649 | 9/1967 | James .......... | 174/52 |

*Primary Examiner*—John F. Campbell
*Assistant Examiner*—Victor A. DiPalma
*Attorney*—Holman & Stern

ABSTRACT: A semiconductor circuit, for example a semiconductor voltage regulator, is manufactured by mounting the active components of the circuit on separate platforms on a conductive strip. The strip is secured to a printed circuit board designed with conductive areas which receive the platforms of the strip to make electrical connections to the platforms, the board itself incorporating passive components of the circuit and the connecting leads between various components in the circuit. After the strip is placed on the board, portions of the strip between the platforms are removed so as to isolate the platforms, and then any connections remaining are made to complete the circuit.

INVENTORS
MICHAEL M. BERTIOLI
DAVID E. MILLINGTON

*INVENTORS*
MICHAEL M. BERTIOLI
DAVID E. MILLINGTON

INVENTORS
MICHAEL M. BERTIOLI
DAVID E. MILLINGTON

METHOD OF MANUFACTURING SEMICONDUCTOR CIRCUITS

This invention relates to the manufacture of semiconductor circuits, particularly semiconductor voltage regulators for use in battery charging systems on road vehicles.

The invention resides in a method of manufacturing a semiconductor circuit, including the following steps:

a. mounting at least some of the active components of the circuit on separate platforms defined by a conductive strip, the platforms being interconnected by a portion of the strip which can be removed to separate the platforms completely, b. securing the strip to a circuit board which is designed with conductive areas positioned to receive the platforms of the strip and so make an electrical connection thereto, the circuit board incorporating at least some of the passive components of the circuit and the connecting leads within the circuit other than the connections between portions of the active components not electrically connected to their respective platforms c. removing said portions of the strip d. securing the remaining components, if any, to the circuit board, and completing any connections not made through the circuit board.

The steps *a*, *b* and *c* must of course be carried out in that order, but step *d* need not follow step *c*. Thus, the additional components could be added to the circuit board at any time during the sequence and the additional connections could be made following any of steps *a*, *b* and *c*.

Figure 1:
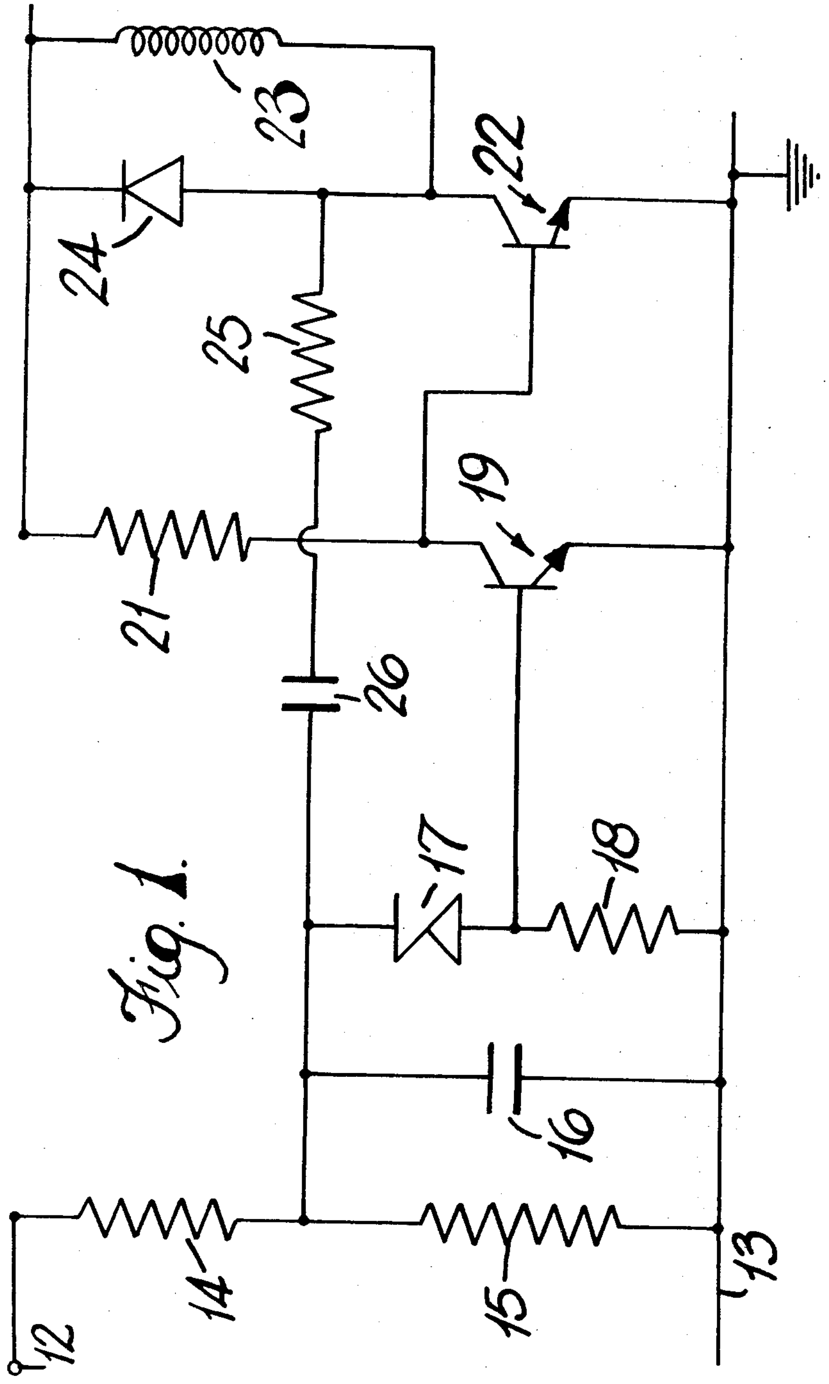
Figure 2:
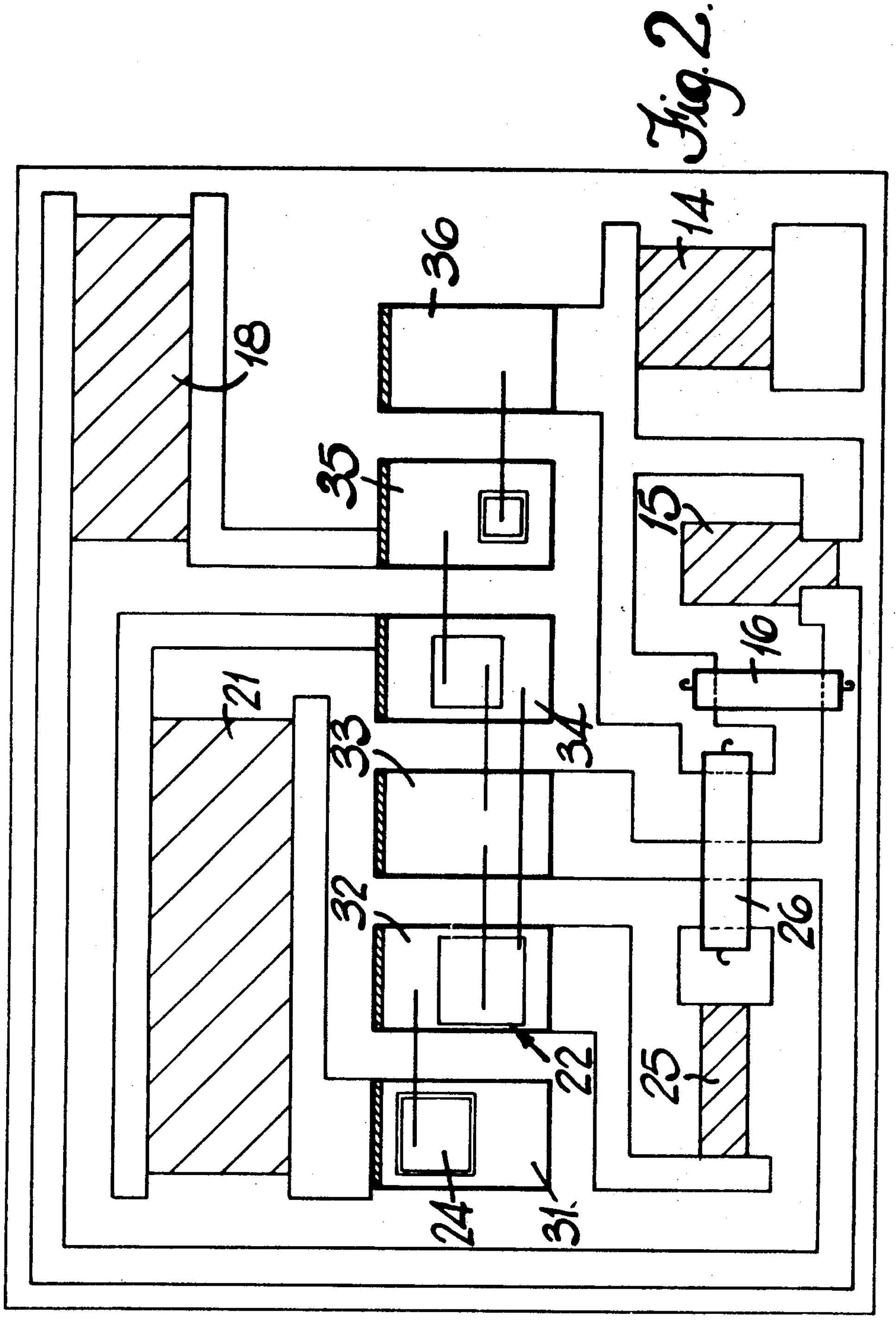
Figure 3:
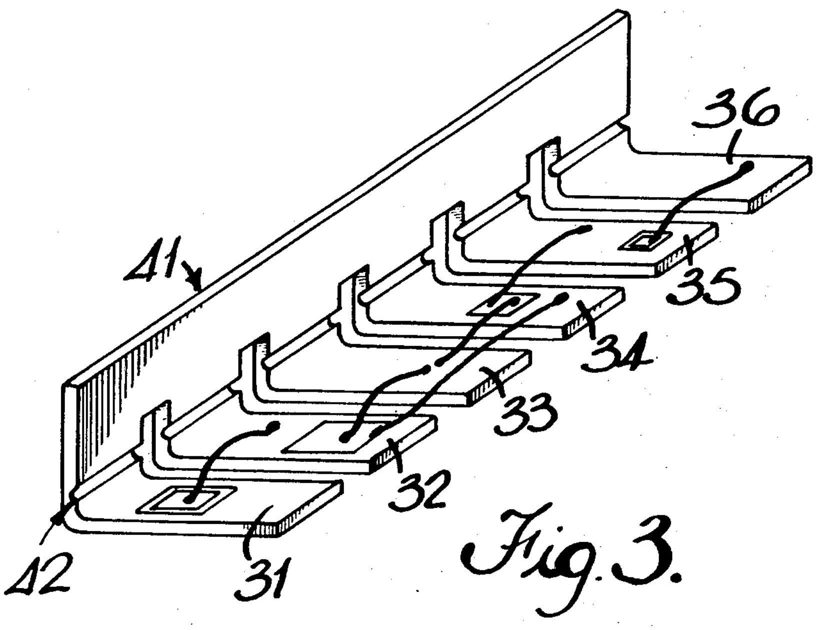

In the accompanying drawings,

FIG. 1 is a circuit diagram illustrating a voltage regulator which can be manufactured in accordance with one example of the invention, FIG. 2 illustrates the position of the various components on a printed circuit board, and FIG. 3 is a perspective view of a conductive strip used in assembling the regulator.

Referring to FIG. 1, the regulator shown is intended for use with an alternator providing power to the battery through a full wave rectifier, and providing further power to a positive supply line 11 through one or more auxiliary diodes. The regulator includes a terminal 12 connected to the positive battery terminal, and a supply line 13 connected to the negative battery terminal, which is earthed.

Connected between the terminal 12 and line 13 in series are a pair of resistors 14, 15 a point intermediate which is connected to the line 13 through a capacitor 16, and is further connected to the cathode of a Zener diode 17, the anode of which is connected to the line 13 through a resistor 18, and is further connected to the base of an NPN transistor 19. The transistor 19 has its emitter connected to the line 13, and its collector connected to the line 11 through a resistor 21. The collector is further connected to the base of a second NPN transistor 22, the emitter of which is connected to the line 13, and the collector of which is connected to the line 11 through the field winding 23 of the alternator, the winding 23 being bridged by a diode 24 in the usual way. The collector of the transistor 22 is further connected through a resistor 25 and a capacitor 26 in series to the cathode of the Zener diode 17.

In operation, when the battery voltage is below a predetermined value, the Zener diode 17 is nonconductive, and the transistor 19 is off. Current flows through the resistor 21 to turn the transistor 22 on, so that current flows in the field winding 23. When the predetermined battery voltage is reached, the Zener diode 17 conducts and provides base current to the transistor 19. By virtue of the feedback connection through resistor 25 and capacitor 26, the circuit oscillates between one state with the transistor 19 fully conductive and the transistor 22 off, and a second state with the transistor 22 fully conducting and the transistor 19 off, the mark-space ratio being determined by the current flowing through the Zener diode 17, which in turn is determined by the battery voltage. The arrangement is such that the mean current flow in the winding 23 maintains the battery voltage substantially constant. The capacitor 16 reduces radio interference.

In manufacturing the regulator, a conductive strip 41 (FIG. 3) is formed having six platforms 31 to 36 which are spaced apart but interconnected by a portion 42 of the strip which can be removed to separate the platforms completely. The strip can be formed in a number of ways for example, starting with a flat rectangular strip, five cuts are made parallel to the shortest side and extending most of the way through the strip to leave six platforms interconnected along one edge of the strip. The strip can then be bent at right angles about a line parallel to and equally spaced from the longer sides, so that if the six platforms are maintained horizontal, they can be separated by removing the upper part of the vertically extending portion of the strip. The portion 42 of the strip may be partially sheared to facilitate its removal.

Considering the six platforms starting from the left-hand end thereof, the platform 31 has mounted thereon the diode 24, with the cathode of the diode electrically connected to the platform 31. On the platform 32 is mounted the transistor 22, with the collector of the transistor electrically connected to the platform 32. Nothing is mounted on the platform 33, but on the platform 34 is mounted transistor 19, with the collector of the transistor 19 electrically connected to the platform 34. The Zener diode 17 is mounted on the platform 35, and the platform 36 is left free.

The strip is secured to a printed circuit board, which is designed with conductive areas positioned to receive the six platforms, as shown in FIG. 2. The capacitors 16 and 26 are added to the printed circuit board and the portion of the conductive strip joining the platforms is severed, so that the platforms are entirely separate. Most of the connections are made on the printed circuit board, which contains in addition the various resistors, but a number of further connections are required between portions of the active components which are not electrically connected to their respective platforms. Thus, the anode of the diode 24 is connected by a lead to the platform 32, so making the required connection to the collector of the transistor 22. The emitters of the transistors 19, 22 are both connected to the platform 33, which is connected to a conductor on the printed circuit board providing an earth connection. In addition, the base of the transistor 22 is connected to the platform 34 to provide the required connection to the collector of the transistor 19, and the base of the transistor 19 is connected to the platform 35 to provide the required connection to the anode of the Zener diode 17. The cathode of the Zener diode 17 is connected to the platform 36, which is connected by way of a circuit printed on the board to the junction of the resistors 14, 15.

The board itself can be formed by printing on an alumina substrate to form a thick film circuit incorporating the various resistors, or can be formed by known thin film techniques.

It will be appreciated that the active components need not be encapsulated before connecting them to the platforms, because it is possible to encapsulate the entire regulator after it has been formed as specified above.

Having thus described our invention what we claim as new and desire to secure by Letters Patent is:

1. A method of manufacturing a semiconductor circuit, including the following steps:

a. mounting at least some of the active components of the circuit on separate platforms defined by a conductive strip, the platforms being interconnected and extending from an upstanding tab portion of the strip which can be removed to separate all the platforms completely, said tab portion being partially sheared along a line to facilitate its removal, b. positioning and securing the strip to a planar circuit board having flat conductive areas positioned to receive the platforms of the strip, and making an electrical connection thereto, the planar circuit board incorporating at least some of the passive components of the circuit and the connecting leads within the circuit other than the connections between portions of the active components not electrically connected to their respective platforms, c. removing and completely separating all platforms of the strip by tearing said upstanding tab along said partially sheared line, d. securing the remaining components, if any, to the circuit board, and completing any connections not made through the circuit board.